(12) United States Patent
Lu et al.

(10) Patent No.: US 12,742,795 B2
(45) Date of Patent: Sep. 22, 2026

(54) PROBE HEAD FOR LOOPBACK TESTING AND METHODS OF FORMING THE SAME

(71) Applicant: Taiwan Semiconductor Manufacturing Company Limited, Hsinchu (TW)

(72) Inventors: Tsai-Ning Lu, Hsinchu (TW); Kuan Chun Chen, Hsinchu City (TW); Guang-Sing Huang, Hsinchu (TW); Yu-Hsuan Cheng, Hsinchu City (TW); Shu An Shang, Kaohsiung City (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 315 days.

(21) Appl. No.: 18/402,774

(22) Filed: Jan. 3, 2024

(65) Prior Publication Data

US 2025/0216419 A1 Jul. 3, 2025

(51) Int. Cl.
*G01R 1/073* (2006.01)
*G01R 1/02* (2006.01)
(Continued)

(52) U.S. Cl.
CPC ..... *G01R 1/07314* (2013.01); *G01R 1/07371* (2013.01); *G01R 31/2886* (2013.01)

(58) Field of Classification Search
CPC ............ G01R 1/02; G01R 1/04; G01R 1/067; G01R 1/073; G01R 31/00; G01R 31/20; G01R 31/28; G01R 31/2886
See application file for complete search history.

(56) References Cited

U.S. PATENT DOCUMENTS 9,423,424 B2 * 8/2016 Hsu .................... G01R 1/07357
2004/0181348 A1 9/2004 Hird et al.
(Continued)

FOREIGN PATENT DOCUMENTS

KR 101421051 * 7/2014 ......... G01R 31/2601
TW 201840988 A 11/2018
TW 202129281 A 8/2021

OTHER PUBLICATIONS

TW Patent and Trademark Office; TW Application No. 113106937; Office Action mailed Dec. 9, 2024; 14 pages.

*Primary Examiner* — Neel D Shah
(74) *Attorney, Agent, or Firm* — The Marbury Law Group, PLLC

(57) ABSTRACT

A probe card for a circuit probe test system and methods of fabrication thereof. The probe card includes a substrate portion, and a probe head including a guide plate located below the substrate portion and having a plurality of openings through the guide plate, and a conductive trace on the guide plate that extends between a pair of the openings. A plurality of probe pins extend through the openings through the guide plate, where a pair of probe pins are electrically connected by the conductive trace to form a loopback signal path. Accordingly, the loopback signals may be routed through the conductive trace located on and/or within the guide plate rather than through the substrate portion of the probe card. This may significantly reduce the total length of the loopback signal path, which may thereby improve the signal integrity (SI) during loopback testing of a device-under-test.

20 Claims, 7 Drawing Sheets

(51) Int. Cl.

| | |
|---|---|
| ***G01R 1/04*** | (2006.01) |
| ***G01R 1/067*** | (2006.01) |
| ***G01R 31/00*** | (2006.01) |
| ***G01R 31/20*** | (2006.01) |
| ***G01R 31/28*** | (2006.01) |

(56) References Cited

U.S. PATENT DOCUMENTS

2018/0100876 A1 4/2018 Pagani
2018/0372939 A1* 12/2018 Wang .................... G06F 1/1641
2019/0377005 A1* 12/2019 Crippa ............... G01R 1/07371

* cited by examiner

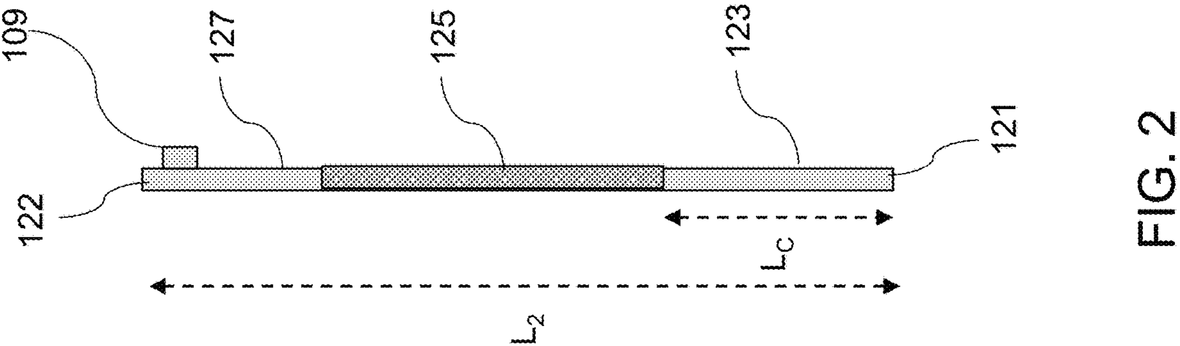
FIG. 2
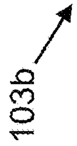

PROBE HEAD FOR LOOPBACK TESTING AND METHODS OF FORMING THE SAME

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is an enlarged vertical cross-section view of a second probe pin according to various embodiments of the present disclosure.

DETAILED DESCRIPTION

Figure 1:
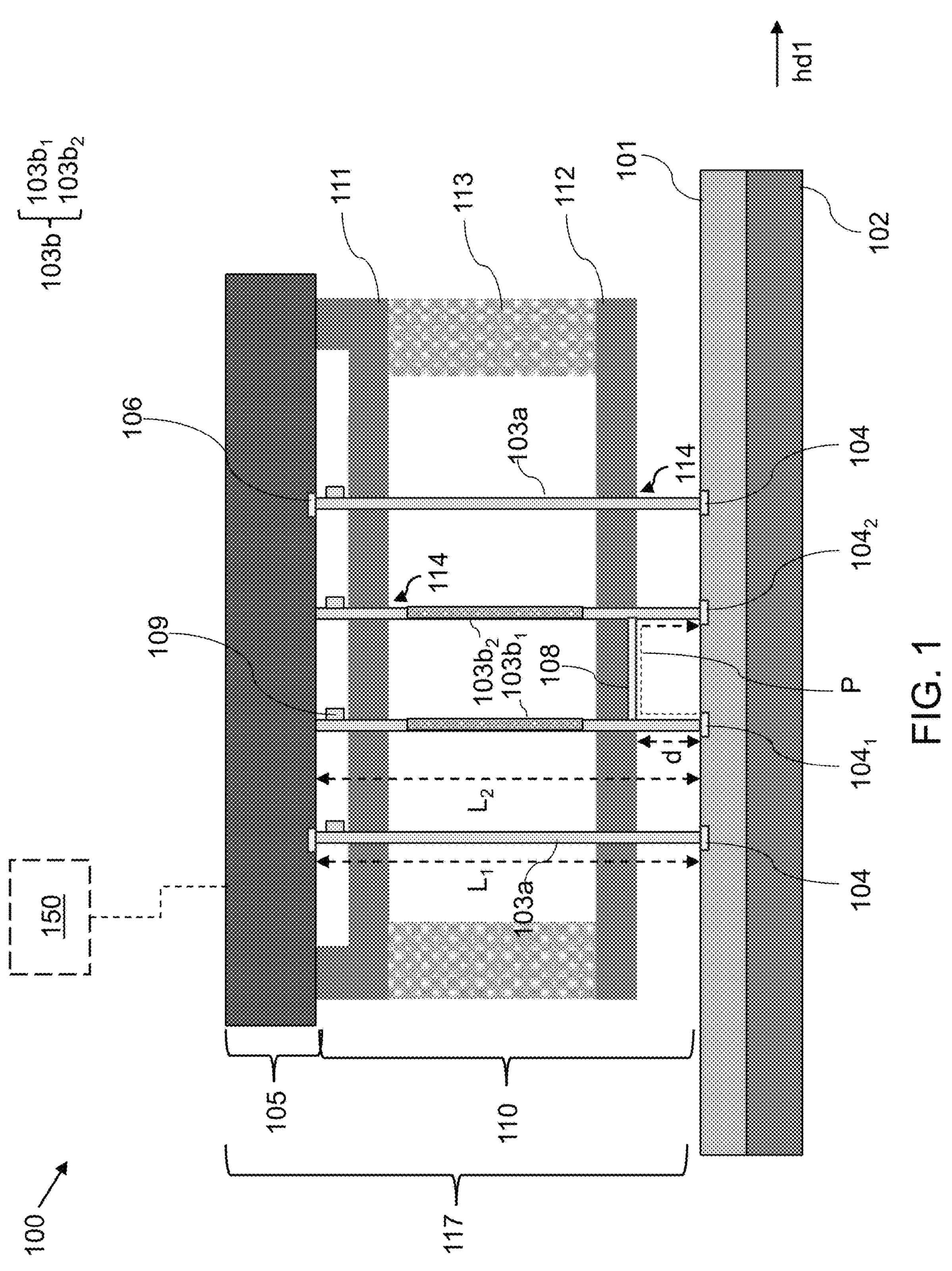
FIG. 1 is a vertical cross-section view of a portion of a circuit probe test system that may be used to perform circuit probe testing, such as loopback testing, of a device under test (DUT) according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

The present disclosure is directed to circuit probe test systems for performing circuit probe testing of electronic devices, such as semiconductor integrated circuit devices, and methods of fabrication thereof.

Circuit probe testing is an important tool during fabrication of electronic devices, such as semiconductor integrated circuit (IC) devices. A circuit probe test system, which may also be referred to as a wafer prober, is a specialized system used to test and validate the designed functionality of electronic circuits. Circuit probe testing may enable the identification of faulty or defective devices (e.g., semiconductor IC devices) at a relatively early stage of the overall production process (e.g., prior to wafer dicing or packaging), which may result in enhanced cost savings.

A circuit probe test system typically includes a probe card having a probe head including a plurality of probe pins that may be brought into contact with contact pads on the device being tested. The probe card may also include a substrate portion including a printed circuit board (PCB) that may function as an interface between the circuit probe test system and the device under test (DUT). The circuit probe test system transmits electrical test signals to the DUT through the substrate portion and the probe pins of the probe head and detects electrical response signals from the DUT that are received through the probe pins and the substrate portion. Each of the probe pins includes an elongate structure having a length of a millimeter or more, such as between 4 mm and 7 mm. The probe head typically also includes a probe head fixture including one or more ceramic guide plates having openings through which the probe pins extend. The probe head fixture is intended to maintain proper alignment of the probe pins during testing while still allowing the probe pins a degree of elastic deformability.

One type of testing that may be performed using a circuit probe test system is a "loopback" test. A loopback test may be used to test communication functionality of a DUT, such as the functionality of the device transmitter (Tx) and/or receiver (Rx) components for different communications protocols (e.g., USB, PCIe, etc.). The probe card may be used to route signals between different contact pads/bumps on the DUT to test the communication functionality of the device. An important parameter for performing circuit probe testing is the signal integrity (SI) of the electronic signals transmitted between the circuit probe test system and the DUT. In the case of loopback testing, the SI is in part a function of the total length of the loopback signal path between different contact pads/bumps on the DUT, where longer loopback signal paths may result in poorer SI performance.

In the case of an above-described probe card design, the loopback signal path is typically routed through the substrate portion of the probe card. Thus, the total length of the loopback path includes the length of the probe pin that carries the signal from the DUT to the substrate portion of the probe card, the length of a conductive path within the substrate portion of the probe card, and the length of probe pin that carries the signal from the substrate portion of the probe card back to the DUT. Thus, the total length of the loopback path is at least twice the length of the probe pins, which can be 8-14 mm or more. This may result in poor SI performance during loopback tests.

Accordingly, there is a need for improvements in circuit probe test systems to provide improved signal integrity (SI) for loopback testing of a device-under-test (DUT). Various embodiments of the present disclosure include a probe card for a circuit probe test system and methods of fabrication thereof. The probe card may include a substrate portion, and a probe head including a guide plate located below the substrate portion and having a plurality of openings through the guide plate, and a conductive trace on the guide plate that extends between a pair of the openings. A plurality of probe pins may extend through the openings through the guide plate, where a pair of probe pins may be electrically connected by the conductive trace to form a loopback signal path. Accordingly, the loopback signals may be routed through the conductive trace located on and/or within the guide plate rather than through the substrate portion of the probe card. This may significantly reduce the total length of the loopback signal path, which may thereby improve the signal integrity (SI) during loopback testing of the DUT.

FIG. 1 is a vertical cross-section view of a portion of a circuit probe test system 100 that may be used to perform circuit probe testing, such as loopback testing, of a device under test (DUT) 101 according to various embodiments of the present disclosure. In some embodiments, the DUT 101 may include a semiconductor substrate, such as a silicon wafer, having circuit components formed on and/or within the semiconductor substrate. Other suitable structures for the DUT 101, such as semiconductor integrated circuit (IC) dies and/or semiconductor IC package structures, are within the contemplated scope of disclosure. The DUT 101 may be located on a lower support member 102, such as a wafer chuck.

Referring again to FIG. 1, the circuit probe test system 100 includes a probe card 117 including a substrate portion 105 and a probe head 110. The circuit probe test system 100 may further include a system controller 150 that may be coupled to an actuator system (not shown) configured to move the probe card 117 along one or more horizontal directions hd1 and hd2 with respect to the lower support member 102 in order to align the probe head 110 over selected regions(s) of the DUT 101. Alternatively, or in addition, the lower support member 102 may be moved to align the probe head 110 over selected region(s) of the DUT 101. In some embodiments, the system controller 150 of the circuit probe test system 100 may be operatively coupled to an optical detection system that may be used to align the probe head 110 over particular region(s) of the DUT 101 using optical pattern recognition. In some embodiments, the probe head 110 of the circuit probe test system 100 may form the distal end of a robotic arm.

The probe head 110 may include a plurality of probe pins 103*a* and 103*b*, which may also be referred to as probe "needles." In the embodiment shown in FIG. 1, the probe head 110 also includes a pair of guide plates, including an upper guide plate 111 and a lower guide plate 112. A spacer 113 may be located between the upper guide plate 111 and the lower guide plate 112. The guide plates 111 and 112 may be formed of suitable structural material(s), such as a ceramic material, an engineered plastic material, or the like. Other suitable materials for the guide plates 111 and 112 are within the contemplated scope of disclosure. The upper guide plate 111 and the lower guide plate 112 may each include a plurality of openings 114 extending through the respective guide plates 111 and 112. The probe pins 103*a* and 103*b* may extend through the openings 114 in the guide plates 111 and 112. The probe pins 103*a* and 103*b* may include fin elements 109 or similar features that prevent the probe pins 103*a* and 103*b* from passing completely through the openings 114 in the upper guide plate 111. The fin elements 109 may be located on a single side of the probe pins 103*a* and 103*b* or on multiple sides or locations.

In some embodiments, the substrate portion 105 of the probe card 117 may include a printed circuit board (PCB) that may include circuit elements that may be utilized for conducting circuit probe testing of the DUT 101. A lower surface of the substrate portion 105 may include electrical contacts 106. In embodiments in which the probe pins 103*a* and 103*b* are inserted through the guide plates 111 and 112, at least some of the probe pins 103*a* and 103*b* may contact electrical contacts 106 on the lower surface of the substrate portion 105. In the embodiment shown in FIG. 1, the probe pins 103*a* and 103*b* may "float" with respect to the substrate portion 105, meaning that the probe pins 103*a* and 103*b* are not bonded or otherwise affixed to the substrate portion 105. In other embodiments, the probe pins 103*a* and 103*b* may be bonded to the electrical contacts 106 on the lower surface of the substrate portion 105, such as via a solder connection.

During a circuit probe test, such as a loopback test, the system controller 150 may move the probe card 117 in a vertically downward direction with respect to DUT 101 to bring the lower portions of the probe pins 103*a* and 103*b* into contact with contact regions (e.g., contact pads, metal bumps, etc.) formed on the DUT 101. Upper portions of the probe pins 103*a* and 103*b* may contact the lower surface of the substrate portion 105 of the probe card 117. The system controller 150 may control the substrate portion 105 to transmit electronic test signals through a first set of one or more probe pins 103*a* and 103*b* to the DUT 101 and to receive response signals back from the DUT 101 through a second set of one or more probe pins 103*a* and 103*b*. In some embodiments, the transmitted test signals and response signals back create a loopback. The detected response signals from the DUT 101 may be analyzed and used to determine whether the DUT 101 includes any functional defects. Based on circuit probe testing, multiple DUTs 101 may be sorted such that defective DUTs 101, or portions thereof, are not used in subsequent fabrication, distribution and/or commercialization processes.

Referring again to FIG. 1, the probe pins 103*a* and 103*b* may include at least one first probe pin 103*a* and at least one second probe pin 103*b*. Each first probe pin 103*a* may be composed of an electrically conductive material, such as a copper palladium alloy. Other suitable electrically conductive materials for the first probe pins 103*a* are within the contemplated scope of disclosure. Each of the first probe pins 103*a* may have a length dimension, $L_1$. In some embodiments, the length dimension, $L_1$, of the first probe pins 103*a* may be less than 7 mm, such as between about 4 mm and about 6 mm, although greater and lesser length dimensions for the first probe pins 103*a* may also be utilized. During a circuit probe test, such as a loopback test, the first probe pins 103*a* may provide a continuous conductive pathway along their length $L_1$ between electrical contacts 106 on the substrate portion 105 of the probe card 117 and contact regions 104 (e.g., contact pads, metal bumps, etc.) on the DUT 101. The first probe pins 103*a* may be used to transmit electrical signals (e.g., input-output (I/O) signals, power signals, ground signals, etc.) between the substrate portion 105 of the probe card 117 and the DUT 101.

The second probe pins 103*b* may have a similar or identical size and shape as the first probe pins 103*a*. The length dimension, $L_2$, of the second probe pins 103*b* may be equivalent to the length dimension, $L_1$, of the first probe pins 103*a*. The second probe pins 103*b* may include an electrically conductive material, such as a copper-palladium alloy. Other suitable electrically conductive materials are within the contemplated scope of discussion. The second probe pins 103*b* may differ from the first probe pins 103*a* in that the second probe pins 103*b* may not provide a continuous conductive pathway along their length $L_2$. Rather, the second probe pins 103*b* may include a lower conductive portion configured to contact a contact region 104 on the DUT 101 and an insulating portion located between the lower conductive portion and the substrate portion 105.

In various embodiments, the second probe pins 103*b* may be used to transmit electronic signals between respective contact regions 104 formed on the DUT 101 via a loopback signal path, P, during a loopback test of the DUT 101. As shown in FIG. 1, the loopback signal path, P, may extend from a first contact region 1041 on the DUT 101 through the lower portion of a first second probe pin 103*b*1, along a conductive trace 108 that may be located on and/or within the lower guide plate 112 and may electrically connect the first second probe pin 103*b*1 to a second second probe pin 103*b*2, and through the lower portion of the second second probe pin 103*b*2 to a second contact region 1042 on the DUT 101.

The loopback signal path, P, as shown in FIG. 1 may be shorter than the loopback signal paths used in related circuit probe test systems. As discussed above, in related circuit probe test systems, the loopback signals are typically routed over the full length, $L_2$, of a first second probe pin 103*b*1, through a conductive trace located on the substrate portion 105 of the probe card 117, and back down the full length $L_2$ of a second second probe pin 103*b*2 to the DUT 101. Thus, the total length of the loopback path P is twice the full length of the probe pins (i.e., $2L_2$) plus the length of the conductive trace on the substrate portion 105, which is typically a function of the distance between the respective contact regions 104 on the DUT 101.

In contrast, the loopback path P in an embodiment circuit probe test system 100 as shown in FIG. 1 includes twice the distance d between the lower tips of the first second probe pin 103*b*1 and second second probe pin 103*b*2 (i.e., 2d) plus the length of the conductive trace 108 on and/or in the lower guide plate 112. Because the distance (d) between the lower tip of each of the second probe pins 103*b* and the conductive trace 108 is less than the full length ($L_1$, $L_2$) of the probe pins 103*a* and 103*b* between the DUT 101 and the substrate portion 105 of the probe head 110, the total length of the loopback signal path P in the embodiment circuit probe test system 100 may be significantly reduced as compared to other related circuit probe test systems. This may provide improved signal integrity (SI) during circuit probe loopback tests. In some embodiments, the distance, d, may be less than 3 mm, including less than 2 mm, such as less than 1.5 mm, including 1 mm or less, in comparison to the ~4-7 mm length dimensions, $L_1$ and $L_2$, of the first probe pins 103*a* and second probe pins 103*b*. In some embodiments, the difference between the total length of the second probe pins 103*b*, $L_2$, and the distance, d, (i.e., $L_2$-d), may be less than about 4 mm.

In the embodiment shown in FIG. 1, the conductive trace 108 is shown on the lower surface of the lower guide plate 112. However, in other embodiments, the conductive trace 108 may be located on the upper surface of the lower guide plate 112 or may be located within the lower guide plate 112. In other embodiments, the conductive trace 108 may be located in another portion of the probe head 110, such as on and/or in the upper guide plate 111. It may be advantageous to provide the conductive trace 108 on a lower portion of the probe head 110, such as the lower surface of the lower guide plate 112 as shown in FIG. 1, in order to minimize the distance d between the DUT 101 and the conductive trace 108 and thereby minimize the total length of the loopback signal path P. Further, although only a single conductive trace 108 is illustrated in FIG. 1, the probe head 110 may include a plurality of conductive traces 108 that may be electrically coupled to and extend between the second probe pins 103*b*. Each conductive trace 108 may be used to electrically connect multiple contact regions 104 of the DUT 101 in series and/or in parallel, during a probe circuit loopback test.

FIG. 2 is an enlarged vertical cross-section view of a second probe pin 103*b* according to various embodiments of the present disclosure. Referring to FIG. 2, the second probe pin 103*b* may have a total length dimension, $L_2$, between a lower tip end 121 and an upper end 122 of the second probe pin 103*b*. The total length dimension, $L_2$, may be between 4 mm and 6 mm in some embodiments. Longer or shorter dimensions may be used. The second probe pin 103*b* may have a lower conductive portion 123 that may extend between the lower tip end 121 and an insulating portion 125 of the second probe pin 103*b*. The length, Lc, of the lower conductive portion 123 may be less than 3 mm, including less than 2 mm, such as less than 1.5 mm, including 1 mm or less. Longer or shorter dimensions may be used.

In some embodiments, the insulating portion 125 of the second probe pin 103*b* may extend over a central region of the second probe pin 103*b*. An upper conductive portion 127 may be extend from the upper end 122 of the second probe pin 103*b* to the insulating portion 125, as shown in FIG. 2. In other embodiments, the upper conductive portion 127 may be omitted, and the insulating portion 125 may extend continuously between the lower conductive portion 123 and the upper end 122 of the second probe pin 103*b*. In various embodiments, the insulating portion 125 of the second probe pin 103*b* may be formed using a selective oxidation process that may be used to oxidize a portion of the second probe pin 103*b* to render the portion of the second probe pin 103*b* to be non-conductive. The selective oxidation process may include selectively exposing a portion of the second probe pin 103*b* to an oxygen plasma treatment while the lower portion 123 and optionally an upper portion 127 are shielded from, or otherwise not exposed to, the oxygen plasma treatment. Other techniques for forming the insulating portion 125 are within the contemplated scope of disclosure. For example, the insulating portion 125 may be formed of a non-electrically conductive material, such as a ceramic or plastic material, that may be bonded or attached to a lower conductive portion 123 and optionally an upper conductive portion 127 that may be composed of an electrically conductive material, such as a metal or metal alloy.

The second probe pin 103*b* shown in FIG. 2 also includes a fin portion 109 near the upper end 122 of the second probe pin 103*b*. In some embodiments, the fin portion 109 may be monolithically formed with the second probe pin 103*b*. The fin portion 109 may help to hold the second probe pin 103*b* in place in the probe head 110 of the circuit probe test system 100 by preventing the second probe pin 103*b* from falling through the opening 114 of the upper guide plate 111 as shown in FIG. 1.

Figure 3:
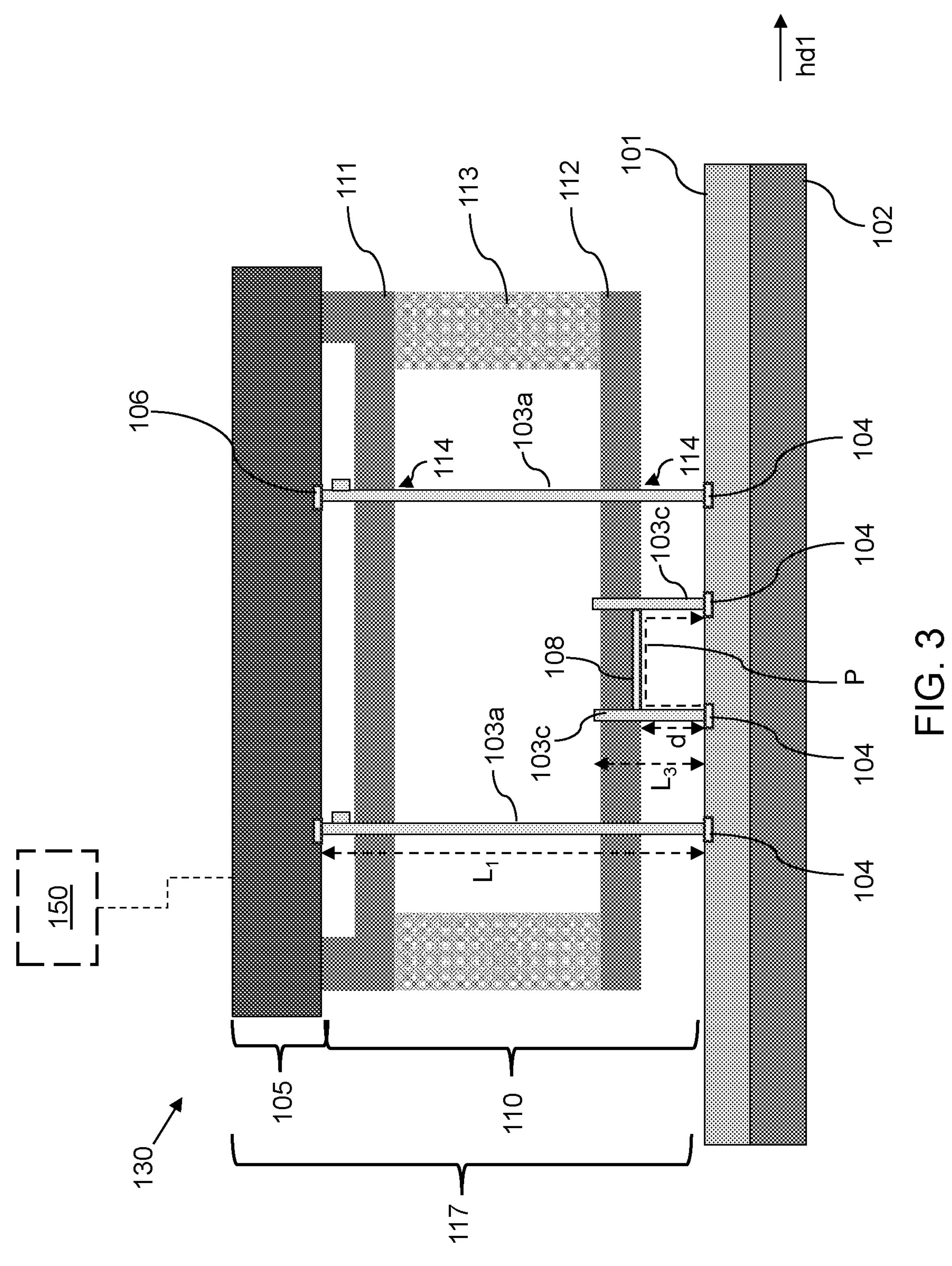
FIG. 3 is a vertical cross-section view of a portion of a circuit probe test system according to another embodiment of the present disclosure.

FIG. 3 is a vertical cross-sectional view of a portion of a circuit probe test system 130 according to another embodiment of the present disclosure. The circuit probe test system 130 shown in FIG. 3 may be similar to the circuit probe test system 100 shown in FIG. 1, and may include a system controller 150 and a probe card 117 including a substrate portion 105, and a probe head 110 including an upper guide plate 111, a lower guide plate 112, a spacer 113 and a plurality of probe pins 103*a* and 103*c*.

The circuit probe test system 130 of FIG. 3 differs from the system shown in FIG. 1 in that the circuit probe test system 130 of FIG. 3 includes one or more third probe pins 103*c*. The one or more third probe pins 103*c* may be in lieu of, or may be in addition to, the second probe pins 103*b* as described above with reference to FIGS. 1 and 2. Each of the third probe pins 103*c* may have a length dimension, $L_3$, that is less than the length dimension, $L_1$, of the first probe pins 103*a*, and is less than the length dimension, $L_2$, of the second probe pins 103*b*. In some embodiments, $L_3$ may be less than 4 mm, including less than 3 mm, such as less than 2 mm, including 1 mm or less. Accordingly, the third probe pins 103*c* may not contact the substrate portion 105 of the probe card 117, and in some embodiments, may not extend through the openings 114 in the upper guide plate 111.

Each of the third probe pins 103*c* may extend through an opening 114 in the lower guide plate 112 and may be configured to contact a contact region 104 of the DUT 101 during a circuit probe loopback test. The third probe pins 103*c* may be composed of a suitable electrically conductive material as described above. In some embodiments, the third probe pins 103*c* may be electrically conductive over their entire lengths, $L_3$ (i.e., they may not include an insulating portion 125 as described above with reference to the second probe pins 103*b*). Each third probe pin 103*c* may electrically contact a conductive trace 108 located on and/or within the lower guide plate 112 that may electrically connect the third probe pin 103*c* with one or more other probe pins 103*a*, 103*c* of the probe head 110. Thus, each third probe pin 103*c* may form a portion of a loopback signal path P between different contact regions 104 of the DUT 101 during a loopback test. As in the embodiment described above with reference to FIGS. 1 and 2, the total length of the loopback signal path P may be equal to twice the distance d of the lower tips of the third probe pins 103*c* to the conductive trace 108 plus the length of the conductive trace 108 extending between the third probe pins 103*c*. This may be less than the length of the loopback signal path in related circuit probe testing systems, which may result in improved signal integrity (SI). In some embodiments, the distance, d, may be less than 3 mm, including less than 2 mm, such as less than 1.5 mm, including 1 mm or less. In some embodiments, the difference between the total length of the third probe pins 103*c*, $L_3$, and the distance, d, (i.e., $L_3$−d), may be less than about 1 mm.

Figure 4:
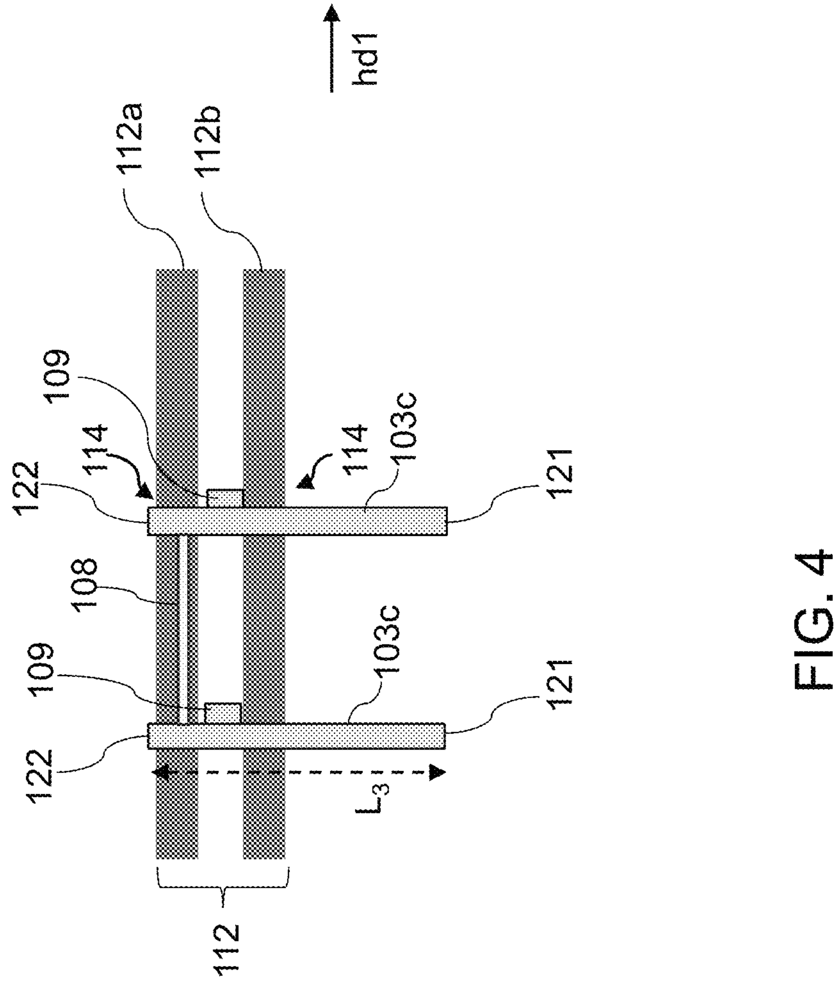
FIG. 4 is a vertical cross-section view illustrating a pair of third probe pins mounted in a lower guide plate according to an embodiment of the present disclosure.

FIG. 4 is a vertical cross-section view illustrating a pair of third probe pins 103*c* mounted in a lower guide plate 112 according to an embodiment of the present disclosure. In the embodiment of FIG. 4, the lower guide plate 112 may have a two-piece construction including an upper portion 112*a* and a lower portion 112*b*. The third probe pins 103*c* may be mounted within the lower guide plate 112 such that fin portions 109 are located between the upper portion 112*a* and the lower portion 112*b* of the lower guide plate 112. In the embodiment shown in FIG. 4, a conductive trace 108 is shown in the upper portion 112*a* of the lower guide plate 112. In other embodiments, the conductive trace 108 may be located on and/or within the lower portion 112*b* of the lower guide plate 112.

Figure 5:
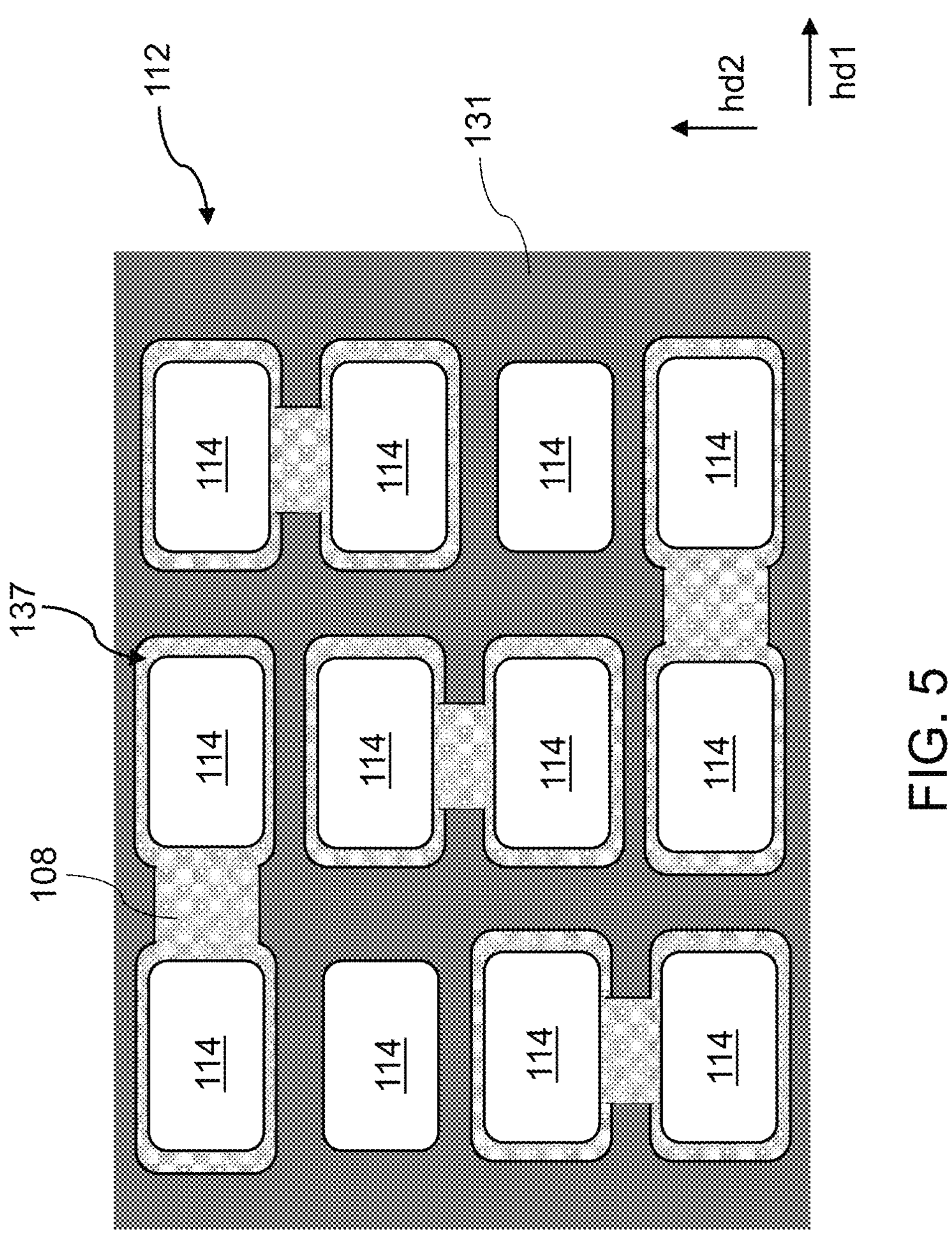
FIG. 5 is an overhead view of a surface of a lower guide plate having conductive traces formed thereon according to various embodiments of the present disclosure.

FIG. 5 is an overhead view of a surface 131 of a lower guide plate 112 having conductive traces 108 formed thereon according to various embodiments of the present disclosure. In some embodiments, the surface 131 may be a lower surface of the lower guide plate 112 when assembled in a probe head 110. Alternatively, the surface 131 may be an upper surface of the lower guide plate 112. Referring to FIG. 5, the lower guide plate 112 may include a plurality of openings 114 that are sized and shaped to enable a plurality of probe pins (not shown in FIG. 5) to extend through the lower guide plate 112. Conductive traces 108 may extend over the surface 131 of the lower guide plate 112 between different openings 114 through the lower guide plate 112. The conductive traces 108 may be formed by providing a coating 137 of an electrically conductive material (e.g., a metal or metal alloy) on the surface 131 of the lower guide plate 112. In some embodiments, the fin portions 109 of probe pins (e.g., 103*b*, 103*c*) may form electrical connections with the coatings 137 as the probe pins (e.g., 103*b*, 103*c*) are raised or lowered to come into contact with the coatings 137. The coating 137 may be formed using a suitable deposition process, such as physical vapor deposition (PVD) (e.g., sputtering), electrochemical deposition (e.g., electroplating), and/or a printing process (e.g., a metal 3D printing process). Other suitable deposition processes are within the contemplated scope of disclosure. In some embodiments, the coating 137 may be deposited in a desired pattern onto the surface 131 of the lower guide plate 112. Alternatively, a continuous coating of conductive material may be deposited over the surface 131 of the lower guide plate 112 and select portions of the coating may be subsequently removed via a suitable technique (e.g., etching through a lithographically-patterned mask, a lift-off process, a laser ablation process, etc.) to provide the desired pattern.

In various embodiments, characteristics of the conductive trace 108, such as the thickness and width of the trace, as well as the voltage carried by the trace referenced to ground, may be selected to match the characteristic impedance of the conductive trace 108 to the system (for example, 35 ohms, 50 ohms or 75 ohms).

As shown in FIG. 5, the coating 137 may extend around the periphery of at least some of the openings 114 through the lower guide plate 112 which may enable a probe pin (e.g., 103*b*, 103*c*) extending through the opening 114 to electrically contact the conductive material of the coating 137. In some embodiments, the coating 137 may extend over the sidewalls of the openings 114 to help provide effective electrical contact between the probe pin (e.g., 103*b*, 103*c*) and the coating 137.

Figure 6:
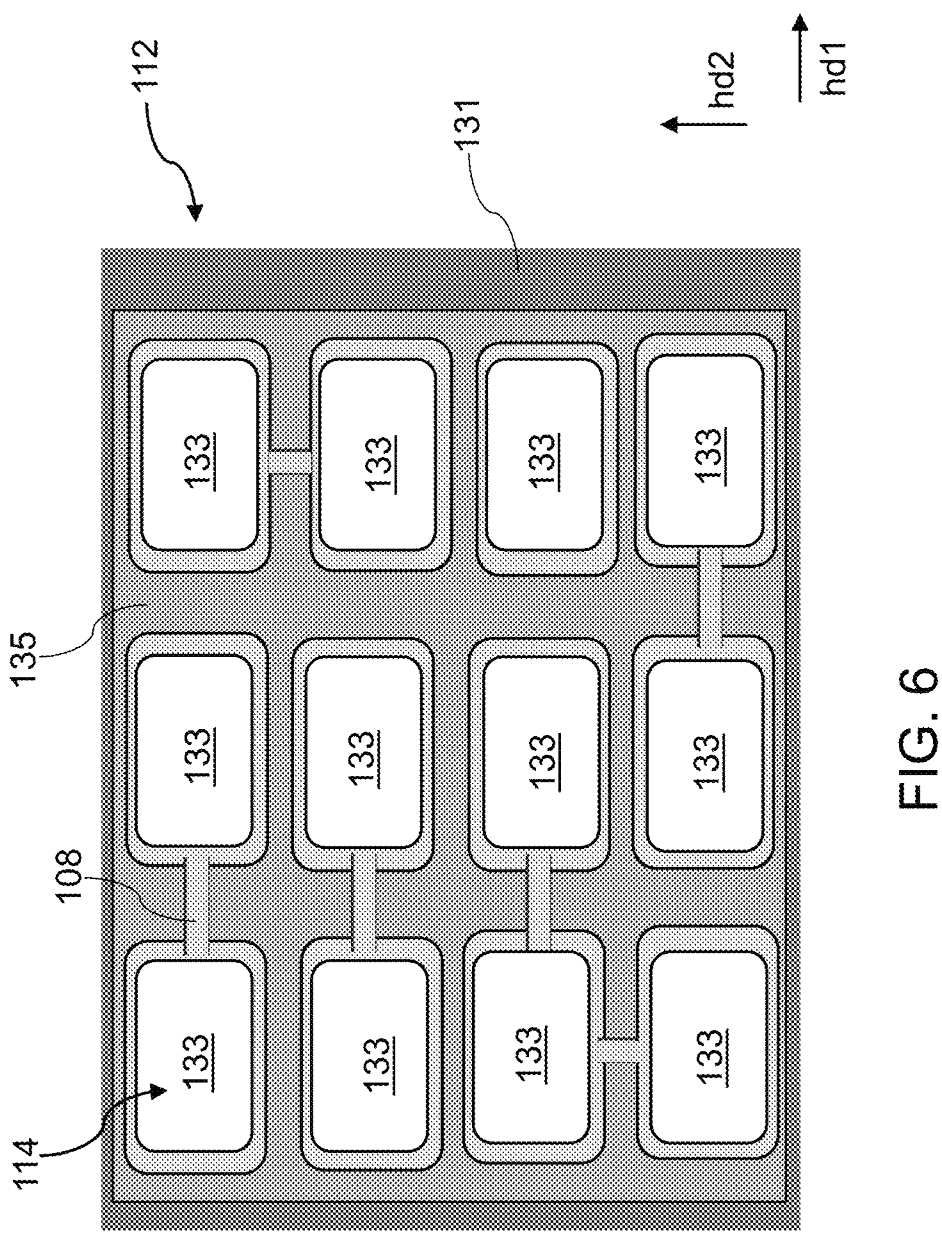
FIG. 6 is an overhead view of a surface of a lower guide plate having conductive traces formed thereon according to another embodiment of the present disclosure.

FIG. 6 is an overhead view of a surface 131 of a lower guide plate 112 having conductive traces 108 formed thereon according to another embodiment of the present disclosure. In the embodiment of FIG. 6, a membrane 135 including conductive traces 108 embedded therein may be affixed to the surface 131 of the lower guide plate 112. The membrane 135 may be composed of a suitable dielectric material, such as a dielectric polymer material (e.g., a polyimide material). Other suitable materials for the membrane 135 are within the contemplated scope of disclosure. The membrane 135 may include openings 133 that may correspond to the locations of the openings 114 through the lower guide plate 112. The membrane 135 may be attached to the surface 131 of the lower guide plate 112 using a suitable adhesive, such as an epoxy glue. The conductive traces 108 may extend around the periphery of at least some of the openings 133 which may enable the probe pins to electrically contact the conductive traces 108.

Figure 7:
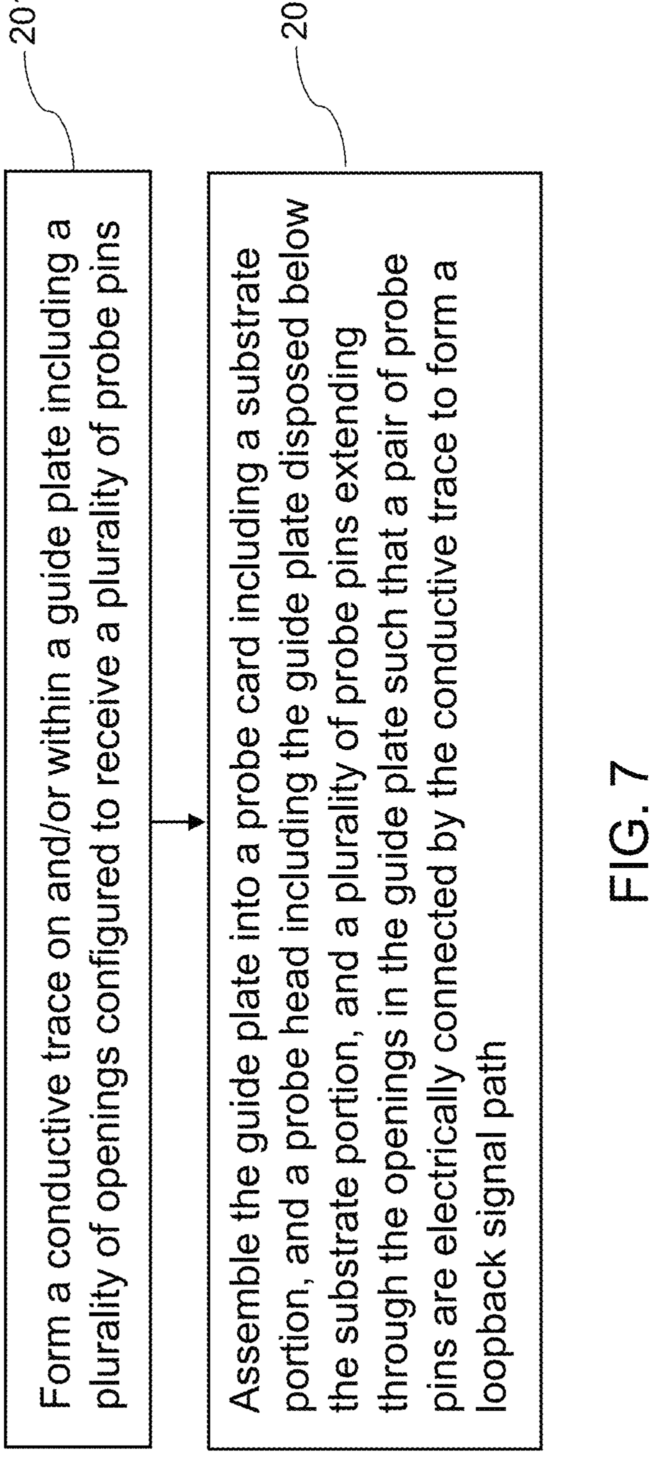
FIG. 7 is a flow chart showing a method of fabricating a probe card for a circuit probe test system according to various embodiments of the present disclosure.

FIG. 7 is a flow chart showing a method 200 of fabricating a probe card 117 for a circuit probe test system 100 according to various embodiments of the present disclosure. Referring to FIGS. 1 and 3-7, in step 201 of method 200, a conductive trace 108 may be formed on and/or within a guide plate 112 including a plurality of openings 114 configured to receive a plurality of probe pins 103*a*, 103*b*, 103*c*. Referring to FIGS. 1, 3 and 7, in step 203 of method 200, the guide plate 112 may be assembled into a probe card 117 including a substrate portion 105, the guide plate 112 disposed below the substrate portion 105, and a plurality of probe pins 103*a*, 103*b*, 103*c* extending through the openings 114 in the guide plate 112 such that a pair of the probe pins 103*b*, 103*c* are electrically connected by the conductive trace 108 to form a loopback signal path P.

Referring to all drawings and according to various embodiments of the present disclosure, a probe card 117 for a circuit probe test system 100, 130 includes a probe head 110 including a guide plate 112 including a plurality of openings 114 through the guide plate 112 and a conductive trace 108 extending between a pair of the openings 114, and a plurality of probe pins 103*a*, 103*b*, 103*c* extending through the openings 114 through the guide plate 112, where a pair of probe pins 103*b*, 103*c* are electrically connected by the conductive trace 108 to form a loopback signal path P.

In an embodiment, the probe card 117 further includes a substrate portion 105, where the guide plate 112 is located below the substrate portion 105 and the plurality of probe pins includes at least one first probe pin 103*a* that forms a continuous conductive pathway along a length $L_1$ of the first probe pin 103*a* between a tip end of the first probe pin 103*a* and the substrate portion 105 of the probe card 117.

In another embodiment, the plurality of probe pins includes at least one second probe pin 103*b* that electrically contacts the conductive trace 108 of the guide plate 112.

In another embodiment, the at least one second probe pin 103*b* includes a lower conductive portion 123 extending from a tip end 121 of the second probe pin 103*b* to the conductive trace 108 of the guide plate 112, and an insulating portion 125 located above the lower conductive portion 123.

In another embodiment, the at least one second probe pin 103*b* includes an upper conductive portion 127 above the insulating portion 125.

In another embodiment, a length $L_2$ of the at least one second probe pin 103*b* is equal to the length $L_1$ of the at least one first probe pin 103*a*.

In another embodiment, the length $L_1$ of the at least one first probe pin 103*a* and the length $L_2$ of the at least one second probe pin 103*b* are at least 4 mm, and a distance d between the tip end 121 of the second probe pin 103*b* to the conductive trace 108 of the guide plate 112 is 3 mm or less.

In another embodiment, the plurality of probe pins includes at least one third probe pin 103*c* that electrically contacts the conductive trace 108 of the guide plate 112, where a length $L_3$ of the at least one third probe pin 103*c* is less than the length $L_1$ of the at least one first probe pin 103*a*.

In another embodiment, the at least one third probe pin 103*c* includes a conductive material over the length $L_3$ of the at least one third probe pin 103*c*.

In another embodiment, the length $L_1$ of the at least one first probe pin is at least 4 mm, and a distance d between the tip end 121 of the third probe pin 103*c* to the conductive trace 108 of the guide plate 112 is 3 mm or less.

In another embodiment, the guide plate is a lower guide plate 112, and the probe head 110 further includes an upper guide plate 111 located between the substrate portion 105 and the lower guide plate 112, where at least a portion of the probe pins 103*a*, 103*b*, 103*c* extend through openings 114 in the upper guide plate 111.

In another embodiment, the conductive trace 108 includes a coating 137 of a conductive material over a surface 131 of the lower guide plate 112.

In another embodiment, the probe head 110 further includes a membrane 135 including a dielectric material having the conductive trace 108 embedded therein that is adhered to a surface 131 of the lower guide plate 112.

In another embodiment, the substrate portion 105 includes a printed circuit board that is configured to transmit test signals to, and receive response signals from, a device-under-test 101 via the plurality of probe pins 103*a*, 103*b*, 103*c* to perform a circuit probe test.

Another embodiment is drawn to a probe card 117 for a circuit probe test system 100 that includes a substrate portion 105, and a probe head including a guide plate 112 located below the substrate portion 105, the guide plate 112 including a plurality of openings 114 through the guide plate 112 and at least one conductive trace 108 extending between openings 114 of the plurality of openings 114, and a plurality of probe pins 103*a*, 103*b*, 103*c* extending through the openings 114 through the guide plate 112, where the plurality of probe pins includes at least one first probe pin 103*a* having a first length dimension $L_1$ that provides a continuous conductive pathway between a tip end of the probe pin 103*a* and the substrate portion 105 of the probe card 117, and at least one second probe pin 103*b* having a second length dimension $L_2$ that is less than the first length dimension $L_1$ that electrically contacts a conductive trace 108 of the guide plate 112.

In an embodiment, the first length dimension $L_1$ is greater than 4 mm and the second length dimension $L_2$ is less than 4 mm.

Another embodiment is drawn to a method of fabricating a probe card 117 for a circuit probe test system 100 that includes forming a conductive trace 108 on and/or within a guide plate 112 including a plurality of openings 114 configured to receive a plurality of probe pins 103*a*, 103*b*, 103*c*, and assembling the guide plate 112 into a probe card 117 including a substrate portion 105, and a probe head including the guide plate 112 disposed below the substrate portion 105, and a plurality of probe pins 103*a*, 103*b*, 103*c* extending through the openings in the guide plate 112 such that a pair of probe pins 103*b*, 103*c* are electrically connected by the conductive trace 108 to form a loopback signal path P.

In an embodiment, the method further includes subjecting at least some of the probe pins 103*b* to an oxygen plasma treatment to form an insulating portion 125 located above a lower conductive portion 123 of the probe pin 103*b*.

In another embodiment, forming the conductive trace 108 on and/or within the guide plate 112 includes coating at least a portion of a surface 131 of the guide plate with an electrically conductive material via at least one of physical vapor deposition, electrochemical deposition, and/or a printing process.

In another embodiment, forming the conductive trace 108 on and/or within the guide plate 112 includes attaching a membrane 135 including a dielectric material having the conductive trace 108 embedded therein to a surface 131 of the guide plate 112 using an adhesive.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A probe card for a circuit probe test system, comprising:
- a substrate portion; and
- a probe head located below the substrate portion, the probe head comprising:
  - a guide plate comprising a plurality of openings through the guide plate and a conductive trace extending between a pair of the openings; and
  - a plurality of probe pins extending through the openings through the guide plate, wherein the plurality of probe pins comprises at least one first probe pin that forms a continuous conductive pathway along a length of the first probe pin between a tip end of the first probe pin and the substrate portion, and the plurality of probe pins comprises a pair of second probe pins that each electrically contact the conductive trace and are electrically connected by the conductive trace to form a loopback signal path, wherein each of the second probe pins does not form a continuous conductive pathway along a length of the second probe pin between a tip end of the second probe pin and the substrate portion.

2. The probe card of claim 1, wherein the at least one second probe pin comprises a lower conductive portion extending from a tip end of the second probe pin to the conductive trace of the guide plate, and an insulating portion located above the lower conductive portion.

3. The probe card of claim 2, wherein the at least one second probe pin comprises an upper conductive portion above the insulating portion.

4. The probe card of claim 2, wherein a length of the at least one second probe pin is equal to the length of the at least one first probe pin.

5. The probe card of claim 4, wherein the length of the at least one first probe pin and the length of the at least one second probe pin are at least 4 mm, and a distance between the tip end of the second probe pin to the conductive trace of the guide plate is 3 mm or less.

6. The probe card of claim 1, wherein a length of at least one of the second probe pins is less than the length of the at least one first probe pin.

7. The probe card of claim 6, wherein the at least one second probe pin having a length less than the length of the at least one first probe pin comprises a conductive material over the length of the second probe pin.

8. The probe card of claim 6, wherein the length of the at least one first probe pin is at least 4 mm, and a distance between a tip end of the at least one second probe pin having a length less than the length of the at least one first probe pin to the conductive trace of the guide plate is 3 mm or less.

9. The probe card of claim 1, wherein the guide plate comprises a lower guide plate, and the probe head further comprises an upper guide plate located between the substrate portion and the lower guide plate, wherein at least a portion of the probe pins extend through openings in the upper guide plate.

10. The probe card of claim 9, wherein the conductive trace comprises a coating of a conductive material over a surface of the lower guide plate.

11. The probe card of claim 9, further comprising a membrane comprising a dielectric material having the conductive trace embedded therein that is adhered to a surface of the lower guide plate.

12. The probe card of claim 1, wherein the substrate portion comprises a printed circuit board that is configured to transmit test signals to, and receive response signals from, a device-under-test via the plurality of probe pins to perform a circuit probe test.

13. A probe card for a circuit probe test system, comprising:
- a substrate portion; and
- a probe head comprising:
  - a guide plate located below the substrate portion, the guide plate comprising a plurality of openings through the guide plate and at least one conductive trace extending between openings of the plurality of openings; and
  - a plurality of probe pins extending through the openings through the guide plate, wherein the plurality of probe pins comprises at least one first probe pin having a first length dimension that provides a continuous conductive pathway between a tip end of the first probe pin and the substrate portion of the probe card, and at least one second probe pin having a second length dimension that is less than the first length dimension that electrically contacts the conductive trace of the guide plate, wherein a tip end of the second probe pin projects below the guide plate to contact a device under test.

14. The probe card of claim 13, wherein the first length dimension is greater than 4 mm and the second length dimension is less than 4 mm.

15. The probe card of claim 13, wherein the guide plate comprises a lower guide plate, and the probe head further comprises an upper guide plate located between the substrate portion and the lower guide plate, wherein the conductive trace is located on or within the upper guide plate.

16. The probe card of claim 13, wherein the conductive trace comprises a patterned coating of a conductive material over a surface of the guide plate that extends between different openings of the plurality of openings.

17. The probe card of claim 13, further comprising a membrane comprising a dielectric material having the conductive trace embedded therein that is adhered to a surface of the guide plate.

18. A method of fabricating a probe card for a circuit probe test system, the method comprising:
- forming a conductive trace on or within a guide plate including a plurality of openings configured to receive a plurality of probe pins, wherein forming the conductive trace on or within the guide plate comprises attaching a membrane comprising a dielectric material having the conductive trace embedded therein to a surface of the guide plate using an adhesive; and
- assembling the guide plate into a probe card comprising a substrate portion, and a probe head comprising the guide plate disposed below the substrate portion, and a plurality of probe pins extending through the openings in the guide plate such that a pair of probe pins are electrically connected by the conductive trace to form a loopback signal path.

19. The method of claim 18, further comprising:

subjecting at least some of the probe pins to an oxygen plasma treatment to form an insulating portion located above a lower conductive portion of the probe pin.

20. The method of claim 19, wherein the insulating portion electrically isolates the lower conductive portion of the probe pin on a first side of the insulating portion from an upper conductive portion of the probe pin on a second side of the insulating portion.

* * * * *